(12) United States Patent
Nishimiya et al.

(10) Patent No.: US 10,468,560 B2
(45) Date of Patent: Nov. 5, 2019

(54) WAVELENGTH CONVERSION MEMBER INCLUDING CAVITY, METHOD FOR PRODUCING SAME, AND LIGHT-EMITTING DEVICE

(71) Applicant: NIPPON ELECTRIC GLASS CO., LTD., Otsu-shi, Shiga (JP)

(72) Inventors: Takashi Nishimiya, Otsu (JP); Hideki Asano, Otsu (JP); Takashi Murata, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 16/078,665

(22) PCT Filed: Mar. 1, 2017

(86) PCT No.: PCT/JP2017/008063
§ 371 (c)(1),
(2) Date: Aug. 22, 2018

(87) PCT Pub. No.: WO2017/217028
PCT Pub. Date: Dec. 21, 2017

(65) Prior Publication Data
US 2019/0044035 A1    Feb. 7, 2019

(30) Foreign Application Priority Data
Jun. 17, 2016   (JP) ................................. 2016-120667

(51) Int. Cl.
*H01L 33/50*    (2010.01)
*H01L 33/48*    (2010.01)
(Continued)

(52) U.S. Cl.
CPC .......... *H01L 33/502* (2013.01); *H01L 33/486* (2013.01); *H01L 33/58* (2013.01); *H05B 33/04* (2013.01)

(58) Field of Classification Search
CPC .............................. H01L 33/504; H01L 33/56
See application file for complete search history.

(56) References Cited

U.S. PATENT DOCUMENTS 7,906,892 B2 *   3/2011   Choi ..................... H01L 33/504
                                                           313/112
2012/0032578 A1 * 2/2012   Annen ................... B82Y 30/00
                                                           313/483
(Continued)

FOREIGN PATENT DOCUMENTS

JP   2005-116817 A   4/2005
JP   2005-183897 A   7/2005
(Continued)

OTHER PUBLICATIONS

Official Communication issued in International Patent Application No. PCT/JP2017/008063, dated Apr. 11, 2017.

*Primary Examiner* — Quoc D Hoang
(74) *Attorney, Agent, or Firm* — Keating & Bennett, LLP

(57) ABSTRACT

Provided is a wavelength conversion member that is less likely to cause deformation or breakage due to thermal expansion and has an excellent light extraction efficiency. A wavelength conversion member 1 that converts a wavelength of excitation light 11 emitted from a light source includes: a container 2 having a frame-shaped sidewall 4; a phosphor layer 6 disposed in the container 2 and containing a resin and a phosphor; a cover member 5 disposed over the sidewall 4 of the container 2 and sealing an interior of the container 2; and a sealing material layer 9 disposed between the sidewall 4 of the container 2 and the cover member 5, wherein the phosphor layer 6 and the cover member 5 are in (Continued)

close contact with each other, and a cavity 10 surrounded by the phosphor layer 6, the cover member 5, and the sealing material layer 9 is provided over the sidewall 4 of the container 2.

8 Claims, 5 Drawing Sheets

(51) Int. Cl.
*H01L 33/58* (2010.01)
*H05B 33/04* (2006.01)

(56) References Cited

U.S. PATENT DOCUMENTS

2014/0103798 A1 4/2014 Yamanaka et al.
2016/0322543 A1* 11/2016 Jeon ..................... H01L 33/505

FOREIGN PATENT DOCUMENTS

| JP | 2015-220330 A | 12/2015 |
| WO | 2010/123059 A1 | 10/2010 |
| WO | 2012/132236 A1 | 10/2012 |
| WO | 2013/001687 A1 | 1/2013 |

\* cited by examiner

[FIG. 1]
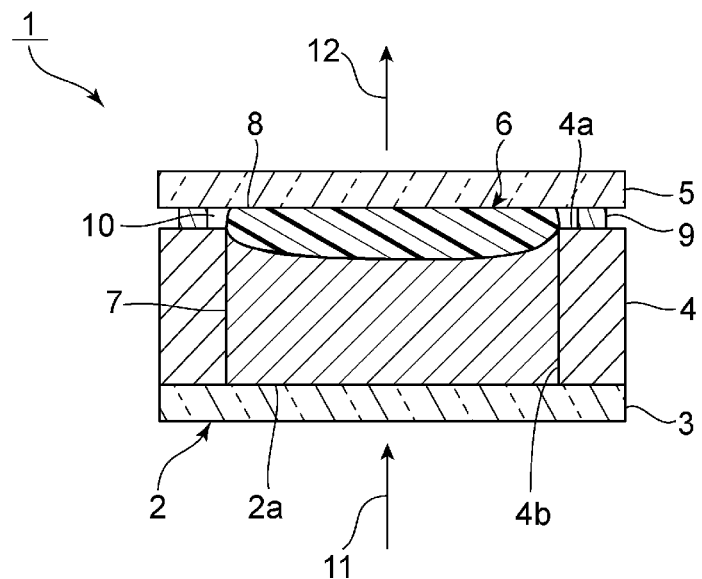
[FIG. 2]
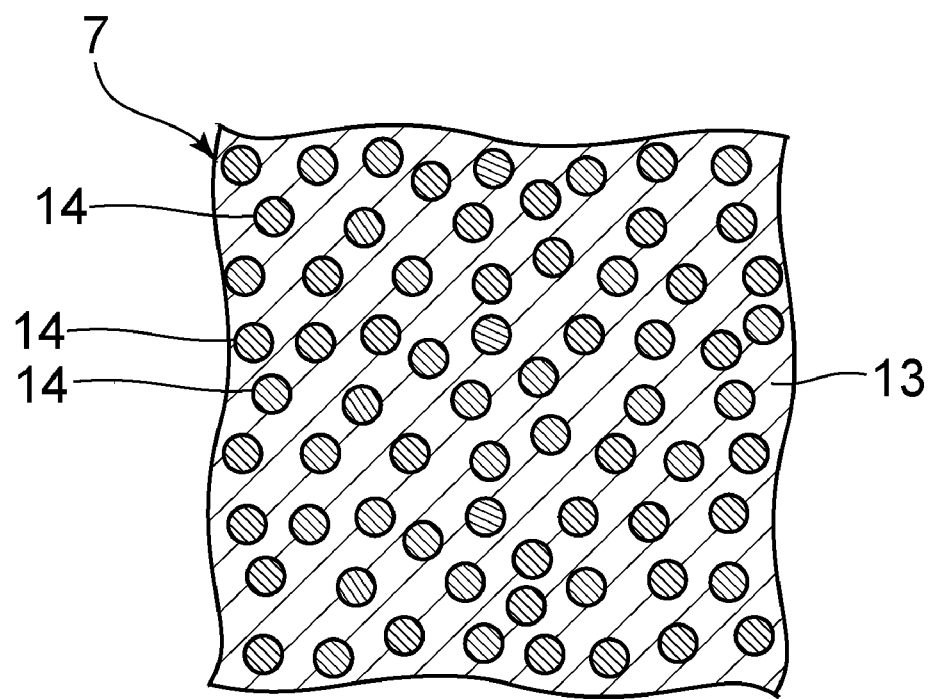

[FIG. 3]
(a)
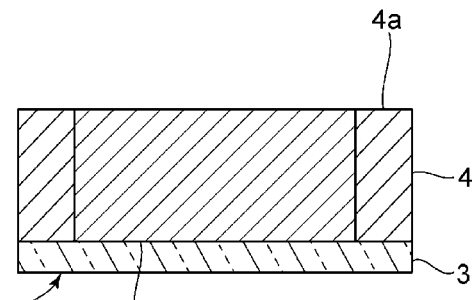
(b)
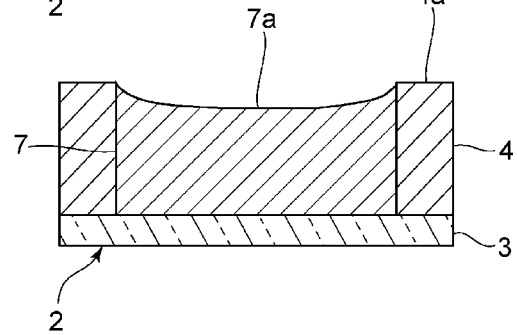
(c)
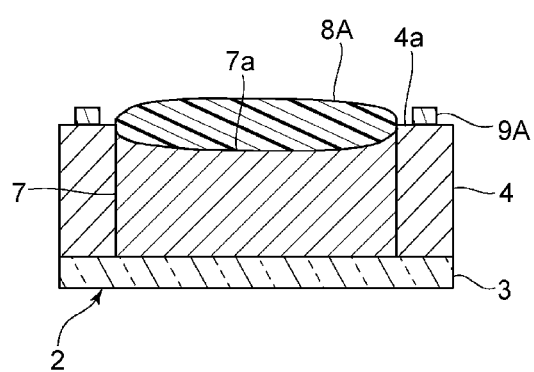
(d)
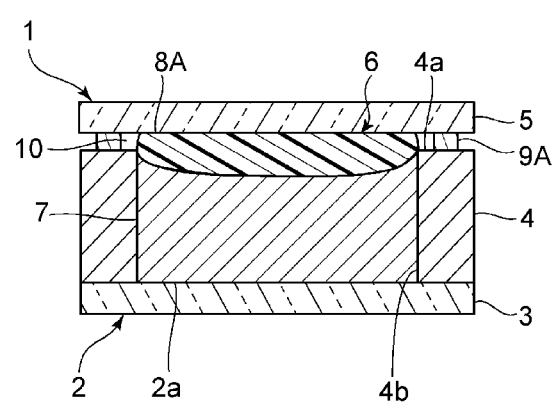

[FIG. 4]
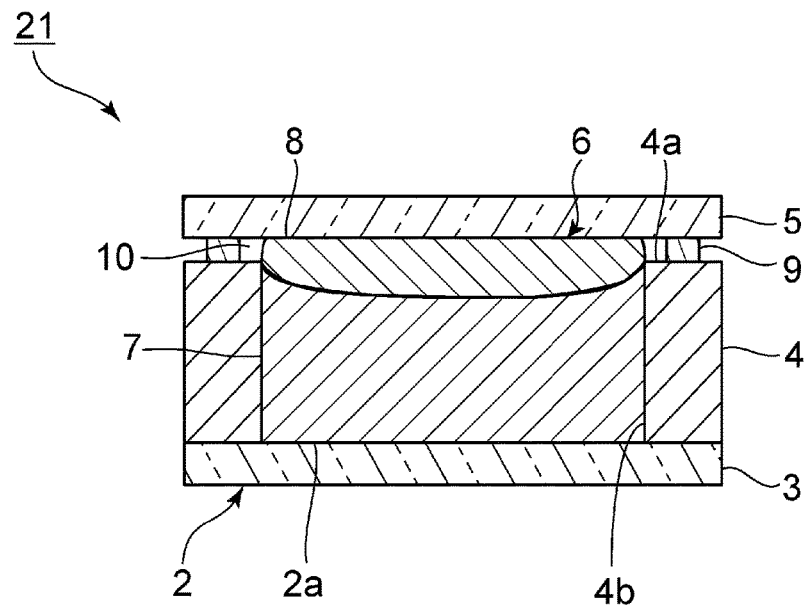
[FIG. 5]
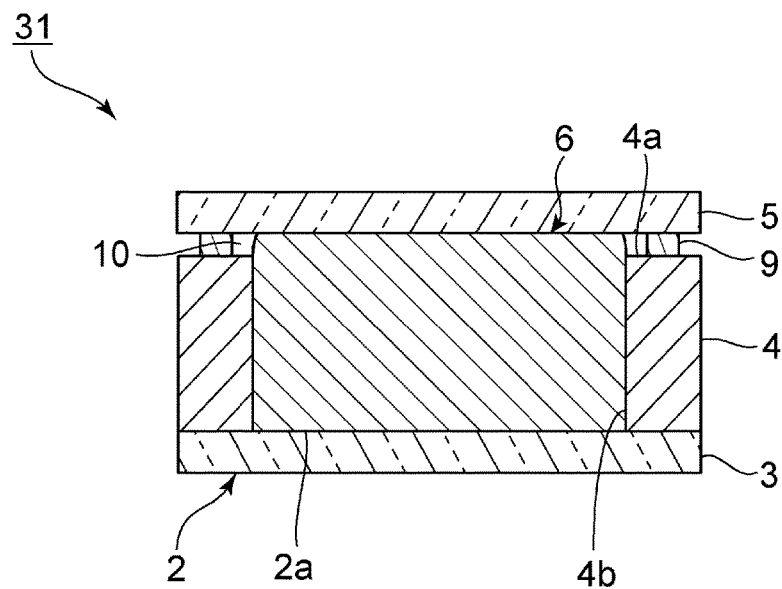

[FIG. 6]
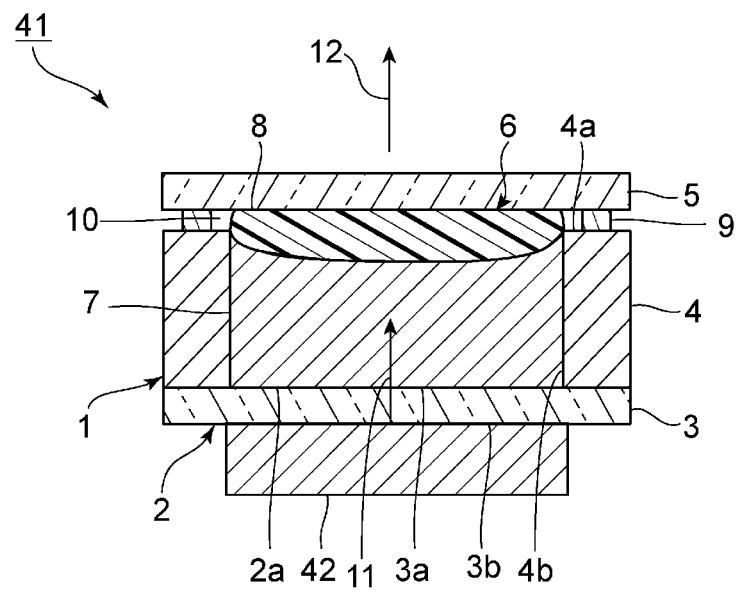
[FIG. 7]
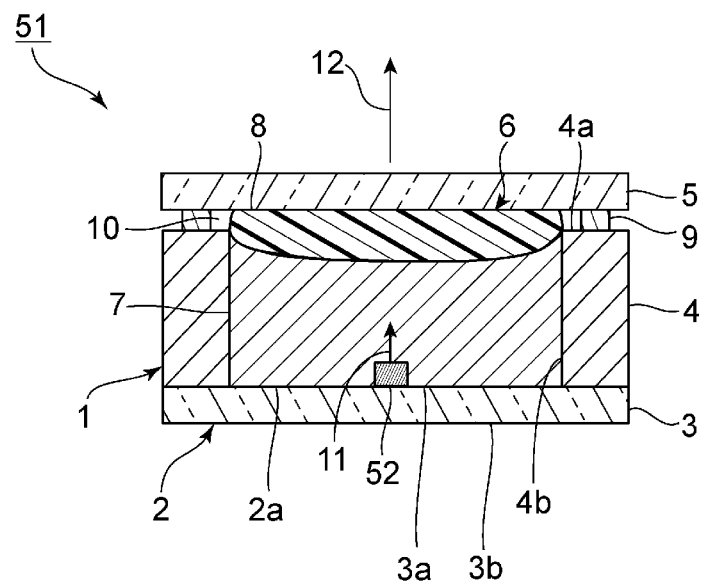

[FIG. 8]
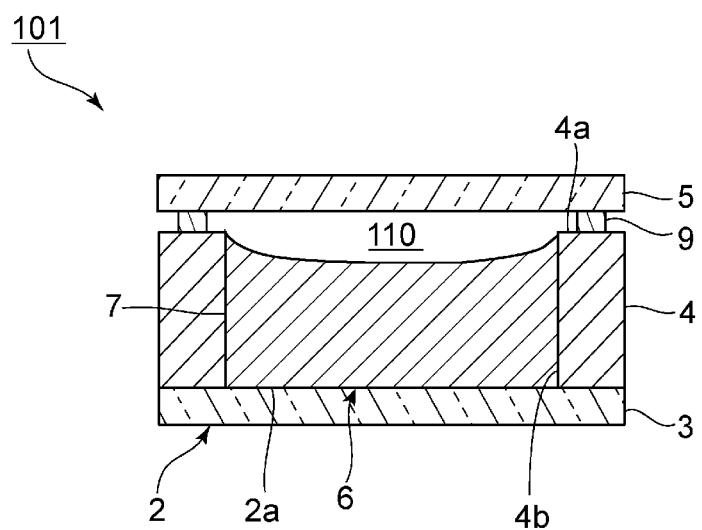

WAVELENGTH CONVERSION MEMBER INCLUDING CAVITY, METHOD FOR PRODUCING SAME, AND LIGHT-EMITTING DEVICE

TECHNICAL FIELD

The present invention relates to wavelength conversion members, methods for producing the same, and light-emitting devices.

BACKGROUND ART

Recently, as next-generation light sources to replace a fluorescence lamp and an incandescent lamp, attention has been focused on light-emitting devices using an excitation light source, such as an LED or an LD. As an example of such a next-generation light source, a light-emitting device is widely known in which an LED for emitting a blue light is combined with a wavelength conversion member capable of absorbing part of the light from the LED to convert it to a yellow light. This light-emitting device emits a white light which is a synthesized light of the blue light emitted from the LED and the yellow light emitted from the wavelength conversion member.

The following Patent Literatures 1 and 2 disclose wavelength conversion members in which a phosphor layer is disposed within a space surrounded by a container and a cover member. In Patent Literature 1, the container is fully filled with a resin layer and the phosphor layer and no cavity is provided in the container. On the other hand, in Patent Literature 2, the phosphor layer is not in contact with the cover member and a cavity is provided between the phosphor layer and the cover member.

CITATION LIST

Patent Literature

[PTL 1]
WO 2010/123059
[PTL 2]
JP-A-2015-220330

SUMMARY OF INVENTION

Technical Problem

If, as in the wavelength conversion member in Patent Literature 1, a container is fully filled with a resin layer and a phosphor layer, the phosphor or the resin expands due to heat generated by luminescence, so that the wavelength conversion member may deform or break. On the other hand, if, as in the wavelength conversion member in Patent Literature 2, a cavity is provided in the container, fluorescence is refracted at the interface between the phosphor layer and the space or the interface between the space and the cover member, so that the light extraction efficiency becomes insufficient.

An object of the present invention is to provide a wavelength conversion member that is less likely to cause deformation or breakage due to thermal expansion and has an excellent light extraction efficiency, a method for producing the wavelength conversion member, and a light-emitting device equipped with the wavelength conversion member.

Solution to Problem

A wavelength conversion member according to the present invention is a wavelength conversion member that converts a wavelength of excitation light emitted from a light source, and includes: a container having a frame-shaped sidewall; a phosphor layer disposed in the container and containing a resin and a phosphor; a cover member disposed over the sidewall of the container and sealing an interior of the container; and a sealing material layer disposed between the sidewall of the container and the cover member, wherein the phosphor layer and the cover member are in close contact with each other, and a cavity surrounded by the phosphor layer, the cover member, and the sealing material layer is provided over the sidewall of the container.

In the present invention, it is preferred that the phosphor layer includes: a first layer containing a resin and a phosphor; and a second layer disposed on the first layer and containing a resin and that the second layer is in close contact with the cover member.

In the present invention, an absolute value of a difference in refractive index between the first layer and the second layer is preferably 0.1 or less.

In the present invention, the second layer may be free of a phosphor.

In the present invention, the second layer may further contain a phosphor.

In the present invention, the first layer and the second layer may be made of the same material.

A method for producing a wavelength conversion member according to the present invention is a method for producing the wavelength conversion member having the above structure according to the present invention and includes the steps of: filling the container with a first curable resin and a phosphor and curing the first curable resin to form a first layer having a recess in a top surface thereof; filling the recess in the first layer with a second curable resin to be a second layer; disposing the cover member in close contact with the second curable resin; curing the second curable resin to form the second layer; and irradiating a sealing material put on a top of the sidewall of the container with laser to soften the sealing material, thus bonding the sidewall of the container and the cover member together.

A light-emitting device according to the present invention includes: a light source that emits excitation light; and the wavelength conversion member having the above structure according to the present invention.

Advantageous Effects of Invention

The present invention enables provision of a wavelength conversion member that is less likely to cause deformation or breakage due to thermal expansion and has an excellent light extraction efficiency.

BRIEF DESCRIPTION OF DRAWINGS

FIG. 1 is a schematic cross-sectional view showing a wavelength conversion member according to a first embodiment of the present invention.

FIG. 2 is a schematic cross-sectional view showing on an enlarged scale a first layer of the wavelength conversion member according to the first embodiment of the present invention.

FIGS. 3(a) to 3(d) are schematic cross-sectional views showing a method for producing the wavelength conversion member according to the first embodiment of the present invention.

FIG. 4 is a schematic cross-sectional view showing a wavelength conversion member according to a second embodiment of the present invention.

FIG. 5 is a schematic cross-sectional view showing a wavelength conversion member according to a third embodiment of the present invention.

FIG. 6 is a schematic cross-sectional view showing a light-emitting device according to a fourth embodiment of the present invention.

FIG. 7 is a schematic cross-sectional view showing a light-emitting device according to a fifth embodiment of the present invention.

FIG. 8 is a schematic cross-sectional view showing a wavelength conversion member as a comparative example.

DESCRIPTION OF EMBODIMENTS

Hereinafter, a description will be given of preferred embodiments. However, the following embodiments are merely illustrative and the present invention is not limited to the following embodiments. Throughout the drawings, members having substantially the same functions may be referred to by the same reference characters.

[Wavelength Conversion Member]

(First Embodiment)

FIG. 1 is a schematic cross-sectional view showing a wavelength conversion member according to a first embodiment of the present invention. FIG. 2 is a schematic cross-sectional view showing on an enlarged scale a first layer of the wavelength conversion member according to the first embodiment of the present invention. As shown in FIG. 1, the wavelength conversion member 1 includes a container 2, a phosphor layer 6, a cover member 5, and a sealing material layer 9.

The container 2 includes a bottom plate 3 and a sidewall 4. In this embodiment, the planar shape of the bottom plate 3 is a rectangular plate shape. Alternatively, the planar shape of the bottom plate 3 may be circular or elliptical and is not particularly limited. A frame-shaped sidewall 4 is disposed on the top of the bottom plate 3. A recess 2a of the container 2 is formed by disposing the sidewall 4 on the top of the bottom plate 3.

The cover member 5 is disposed over a top surface 4a of the sidewall 4. The cover member 5 is a member for sealing the interior of the container 2. The sealing material layer 9 is provided between the sidewall 4 and the cover member 5. The sidewall 4 and the cover member 5 are bonded together by the sealing material layer 9.

The phosphor layer 6 is disposed in the recess 2a of the container 2. The phosphor layer 6 includes a first layer 7 and a second layer 8. The second layer 8 is provided on top of the first layer 7. The second layer 8 is in close contact with the cover member 5.

As shown in FIG. 2, the first layer 7 is formed of a phosphor 14 and a resin 13. The phosphor 14 is dispersed into the resin 13. Referring back to FIG. 1, the second layer 8 is made of a resin. In this embodiment, the second layer 8 is free of a phosphor. Alternatively, in the present invention, the second layer 8 may contain a phosphor.

Furthermore, a cavity 10 is provided in the recess 2a of the container 2. The cavity 10 is provided over the sidewall 4. The cavity 10 is surrounded by the phosphor layer 6, the cover member 5, and the sealing material layer 9.

The wavelength conversion member 1 converts a wavelength of excitation light 11 emitted from a light source. More specifically, the excitation light 11 enters the wavelength conversion member 1 through the bottom plate 3. The incident excitation light 11 passes through the bottom plate 3 and then enters the phosphor layer 6. The excitation light 11 excites the phosphor 14 in the phosphor layer 6, so that fluorescence 12 is emitted. The fluorescence 12 or a mixed light of the fluorescence 12 and the excitation light 11 is emitted through the cover member 5. In this embodiment, the cavity 10 is not provided in an optical path for the fluorescence 12 or the mixed light of the fluorescence 12 and the excitation light 11. In the optical path, the second layer 8 is provided in close contact with the cover member 5. The optical path refers to a region located inwardly of an inside surface 4b of the sidewall 4.

Since in this embodiment the cavity 10 is provided over the sidewall 4 as described above, even if the phosphor 14 or the resin 13 expands due to heat generated by luminescence, the volume of the cavity 10 is compressed, which makes the deformation or breakage of the wavelength conversion member 1 less likely to occur. Furthermore, since the wavelength conversion member 1 is free of cavity 10 in the optical path, it has an excellent light extraction efficiency. This will be described in further detail using a wavelength conversion member as a comparative example.

FIG. 8 is a schematic cross-sectional view showing a wavelength conversion member as a comparative example. As shown in FIG. 8, the wavelength conversion member 101 is provided in its optical path with no second layer. More specifically, in the optical path, a cavity 110 is provided between a first layer 7 and a cover member 5. Therefore, the wavelength conversion member 101 has an interface between the first layer 7 and the cavity 110, i.e., an interface between the first layer 7 and air, which is formed in the optical path. The first layer 7 is formed of a phosphor 14 and a resin 13 and, therefore, has a large difference in refractive index from the air. Thus, part of light is reflected at the interface between the first layer 7 and the cavity 110, so that the light extraction efficiency decreases.

Unlike the above, in this embodiment, no cavity is provided between the first layer 7 and the cover member 5 in the optical path. In this embodiment, the second layer 8 is provided between the first layer 7 and the cover member 5 in the optical path. Since the second layer 8 is made of a resin, the absolute value of the difference in refractive index between the first layer 7 and the second layer 8 is smaller than that of the difference in refractive index between the first layer 7 and the air. Therefore, the wavelength conversion member 1 according to this embodiment is less likely to reflect light at the interface between the first layer 7 and the second layer 8 and thus has an excellent light extraction efficiency.

From the viewpoint of further increasing the light extraction efficiency, the absolute value of the difference in refractive index (nd) between the first layer 7 and the second layer 8 is preferably 0.1 or less. The absolute value of the difference in refractive index is more preferably 0.08 or less, still more preferably 0.05 or less, particularly preferably 0.03 or less, and most preferably 0.01 or less.

In order to still further increase the light extraction efficiency, it is preferred to reduce refraction or reflection of light at the interface between the cover member 5 and the second layer 8 and the difference in refractive index (nd) between the cover member 5 and the second layer 8 is preferably 0.20 or less. The difference in refractive index is more preferably 0.12 or less, still more preferably 0.08 or less, particularly preferably 0.04 or less, and most preferably 0.01 or less.

A description will be given below of a method for producing a wavelength conversion member 1 as an example with reference to FIGS. 3(a) to 3(d).

Production Method;

First, a container 2 is prepared. The container 2 can be formed by bonding, with a frame-shaped sidewall 4 placed on top of a bottom plate 3, the bottom plate 3 and the sidewall 4 together. No particular limitation is placed on the method for bonding the bottom plate 3 and the sidewall 4 together and they may be bonded together using a sealing material, such as a glass frit, or may be bonded together using an adhesive. Alternatively, a container obtained by integrally molding the bottom plate 3 and the sidewall 4 may be prepared as the container 2.

Next, a recess 2a of the container 2 is filled with a first curable resin and a phosphor. In doing so, as shown in FIG. 3(a), the recess 2a is filled with the first curable resin and the phosphor, preferably to the same height as that of a top surface 4a of the sidewall 4. Subsequently, as shown in FIG. 3(b), the first curable resin is cured to form a first layer 7 having a recess 7a in its top surface.

Next, the recess 7a of the first layer 7 is filled with a second curable resin 8A to be a second layer 8. In doing so, as shown in FIG. 3(c), the recess 7a is filled with the second curable resin 8A, preferably above the top surface 4a of the sidewall 4. By adjusting the amount of the second curable resin 8A, the size of the cavity 10 located over the sidewall 4 can be controlled.

Next, as shown in FIG. 3(d), the cover member 5 is placed through a sealing material 9A on the top surface 4a of the sidewall 4 of the container 2. In doing so, the cover member 5 is placed to make close contact with the second curable resin 8A. In this state, the second curable resin 8A is cured to form a second layer 8. Next, with the cover member 5 placed through the sealing material 9A on the top surface 4a of the sidewall 4, the sealing material 9A is irradiated with laser from a laser light source and thus softened to bond the sidewall 4 of the container 2 and the cover member 5 together. In this manner, a wavelength conversion member 1 shown in FIG. 1 is obtained. An example of the laser that can be used is a laser having a wavelength of 600 nm to 1600 nm.

In the wavelength conversion member 1 obtained by the production method according to this embodiment, a cavity 10 is provided over the sidewall 4. Therefore, even if the phosphor 14 or the resin 13 expands due to heat generated by luminescence, the volume of the cavity 10 is compressed, which makes the deformation or breakage of the wavelength conversion member 1 less likely to occur. Furthermore, since the wavelength conversion member 1 is free of cavity 10 in the optical path, it has an excellent light extraction efficiency. Moreover, in the wavelength conversion member 1, the cavity 10 is formed near the sealing material layer 9 and no resin exists near the sealing material layer 9. Therefore, the resin is less likely to be volatilized by heat generated during laser irradiation.

A description will be given below of details of materials forming the wavelength conversion member according to the present invention, such as the wavelength conversion member 1.

Container;

The container includes a bottom plate and a sidewall. The sidewall is provided on the top of the bottom plate.

The bottom plate can be made of a transparent material. For example, a glass can be used as the material making up the bottom plate. Examples of the glass that can be used include $SiO_2$—$B_2O_3$—RO-based glasses (where R is Mg, Ca, Sr or Ba), $SiO_2$—$B_2O_3$—$R'_2O$-based glasses (where R' is Li, Na or Ka), $SiO_2$—$B_2O_3$—RO—$R'_2O$-based glasses (where R' is Li, Na or Ka), SnO—$P_2O_5$-based glasses, $TeO_2$-based glasses, and $Bi_2O_3$-based glasses.

The sidewall is preferably made of a ceramic having a high reflectivity. In this case, excitation light and fluorescence can be reflected, which enables a further increase in light use efficiency. An example of the high-reflectivity ceramic that can be cited is a low temperature cofired ceramic (LTCC). Examples of the LTCC that can be used include alumina-glass-based ceramics.

The container may be one obtained by integrally molding the bottom plate and the sidewall. In the case of a container in which the bottom plate and the sidewall are integrally molded, the deformation of the container during curing of the filled resin in the recess of the container can be further reduced.

First Layer;

The first layer contains a resin and a phosphor. The phosphor is preferably dispersed in the resin.

Examples of resins to be used as the resin contained in the first layer include curable resins, such as ultraviolet curable resins and thermosetting resins. Specifically, for example, epoxy-based curable resins, acrylic UV-curable resins, and silicone-based curable resins can be used. The curable resin is preferably a light-transmissive resin.

For example, quantum dots can be used as the phosphor. Examples of such quantum dots that can be cited include group II-VI compounds and group III-V compounds. Examples of such group II-VI compounds that can be cited include CdS, CdSe, CdTe, ZnS, ZnSe, and ZnTe. Examples of such group III-V compounds that can be cited include InP, GaN, GaAs, GaP, AlN, AlP, AlSb, InN, InAs, and InSb. At least one or a composite of two or more selected from the above compounds can be used as the quantum dots. Examples of such composites that can be cited include those having a core-shell structure, for example, a composite having a core-shell structure in which the surfaces of CdSe particles are coated with ZnS.

The phosphor to be used is not limited to quantum dots and, for example, particles of an inorganic phosphor, such as oxide phosphor, nitride phosphor, oxynitride phosphor, chloride phosphor, oxychloride phosphor, sulfide phosphor, oxysulfide phosphor, halide phosphor, chalcogenide phosphor, aluminate phosphor, halophosphoric acid chloride phosphor, or garnet-based compound phosphor, may be used.

Second Layer;

The second layer contains a resin. The second layer may contain a phosphor or may be free of a phosphor.

Examples of resins to be used as the resin contained in the second layer include curable resins, such as ultraviolet curable resins and thermosetting resins. Specifically, for example, epoxy-based curable resins, acrylic UV-curable resins, and silicone-based curable resins can be used. The curable resin is preferably a light-transmissive resin.

In incorporating a phosphor into the second layer, an appropriate one of the above-mentioned phosphors cited as examples in relation to the first layer can be used.

Sealing Material Layer;

The sealing material layer can be made of a sealing material, for example, a glass frit. An example of the glass frit that can be used is a glass frit melting by laser irradiation.

An example of the glass frit melting by laser irradiation is a glass frit containing: inorganic powder containing SnO-containing glass powder; and a pigment.

The SnO-containing glass preferably contains as a glass composition, in % by mass, 35 to 70% SnO and 10 to 30% $P_2O_5$. SnO is a component for decreasing the melting point of the glass. $P_2O_5$ is a component for increasing the thermal stability of the glass.

The SnO-containing glass may further contain ZnO, $B_2O_3$, $Al_2O_3$, $SiO_2$, $In_2O_3$, $Ta_2O_5$, $La_2O_3$, $MoO_3$, $WO_3$, $Li_2O$, $Na_2O$, $K_2O$, MgO, BaO, $F_2$, and/or others.

The pigment is preferably an inorganic pigment and preferably contains, for the purpose of easy absorption of laser light to generate heat, at least one metal selected from the group consisting of Fe, Mn, Cu, and the like or a compound containing the at least one metal.

Cover Member;

The cover member can be made of a transparent material. For example, a glass can be used as the material making up the cover member. Examples of the glass that can be used include $SiO_2$—$B_2O_3$—RO-based glasses (where R is Mg, Ca, Sr or Ba), $SiO_2$—$B_2O_3$—$R'_2O$-based glasses (where R' is Li, Na or Ka), $SiO_2$—$B_2O_3$—RO—$R'_2O$-based glasses (where R' is Li, Na or Ka), SnO—$P_2O_5$-based glasses, $TeO_2$-based glasses, and $Bi_2O_3$-based glasses.

If the bottom plate and/or the cover member are made of glass, passage of moisture and oxygen can be further reduced. In this case, because the phosphor contained in the phosphor layer is less likely to be deteriorated, a high-reliability wavelength conversion member can be obtained.

(Second and Third Embodiments)

FIG. 4 is a schematic cross-sectional view showing a wavelength conversion member according to a second embodiment of the present invention. In the wavelength conversion member 21, the second layer 8 is made of the same material as the first layer 7. Therefore, the second layer 8 is made of a resin and a phosphor and the phosphor is dispersed in the resin. The rest is the same as in the first embodiment.

Furthermore, FIG. 5 is a schematic cross-sectional view showing a wavelength conversion member according to a third embodiment of the present invention. In the wavelength conversion member 31, the first layer and the second layer are integrated in the phosphor layer 6. The phosphor layer 6 is made of the same material as the first layer 7 of the wavelength conversion member 1. The rest is the same as in the first embodiment.

Since also in the second and third embodiments the cavity 10 is provided over the sidewall 4, even if the phosphor or the resin expands due to heat generated by luminescence, the deformation or breakage of the wavelength conversion members 21 and 31 is less likely to occur. Furthermore, since the wavelength conversion members 21 and 31 are free of cavity 10 in their optical paths, they have an excellent light extraction efficiency.

In addition, in the second embodiment, since the first layer 7 and the second layer 8 are made of the same material, the absolute value of the difference in refractive index between the first layer 7 and the second layer 8 is further reduced. Therefore, the light extraction efficiency is further increased.

In the third embodiment, since the first layer and the second layer are integrated, there is no interface between the first layer and the second layer. Therefore, the light extraction efficiency is still further increased.

[Light-Emitting Device]

(Fourth Embodiment)

FIG. 6 is a schematic cross-sectional view of a light-emitting device according to a fourth embodiment of the present invention. As shown in FIG. 6, the light-emitting device 41 includes a light source chip 42 and the wavelength conversion member 1. The light source chip 42 is provided on a principal surface 3b of the bottom plate 3 of the wavelength conversion member 1. The principal surface 3b is a principal surface of the bottom plate 3 located on a side thereof opposite to the phosphor layer 6.

For example, a light source, such as an LED light source or a laser light source, which emits a blue light, is used as the light source chip 42.

In the light-emitting device 41, excitation light 11 emitted from the light source chip 42 passes through the bottom plate 3 and then enters the phosphor layer 6. The excitation light 11 having entered the wavelength conversion member 1 is converted in wavelength and then emitted as fluorescence 12 to the outside. For example, if a blue light is used as the excitation light 11, the blue light is converted into a yellow light by the wavelength conversion member 1, so that a white light produced by synthesizing the blue light with the yellow light can be emitted as fluorescence 12.

(Fifth Embodiment)

FIG. 7 is a schematic cross-sectional view of a light-emitting device according to a fifth embodiment of the present invention. As shown in FIG. 7, in the light-emitting device 51, a light source chip 52 is provided on a principal surface 3a of the bottom plate 3 of the wavelength conversion member 1. The principal surface 3a of the bottom plate 3 is a principal surface thereof located toward the phosphor layer 6.

In the light-emitting device 51, excitation light 11 emitted from the light source chip 52 directly enters the phosphor layer 6. The rest is the same as in the fourth embodiment.

Since the light-emitting devices 41 and 51 according to the fourth and fifth embodiments include the wavelength conversion member 1 according to the first embodiment and the cavity 10 is provided over the sidewall 4, even if the phosphor or the resin expands due to heat generated by luminescence, the deformation or breakage of the wavelength conversion members 41 and 51 is less likely to occur. Furthermore, since the light-emitting devices 41 and 51 are free of cavity 10 in their optical paths, they have an excellent light extraction efficiency.

REFERENCE SIGNS LIST 1, 21, 31 . . . wavelength conversion member
2 . . . container
2a . . . recess
3 . . . bottom plate
3a, 3b . . . principal surface
4 . . . sidewall
4a . . . top surface
4b . . . inside surface
5 . . . cover member
6 . . . phosphor layer
7, 8 . . . first and second layers
7a . . . recess
8A . . . second curable resin
9 . . . sealing material layer
9A . . . sealing material
10 . . . cavity
11 . . . excitation light
12 . . . fluorescence
13 . . . resin
14 . . . phosphor
41, 51 . . . light-emitting device
42, 52 . . . light source chip

The invention claimed is:

1. A wavelength conversion member that converts a wavelength of excitation light emitted from a light source, the wavelength conversion member comprising:

a container having a frame-shaped sidewall;

a phosphor layer disposed in the container and containing a resin and a phosphor;

a cover member disposed over the sidewall of the container and sealing an interior of the container; and a sealing material layer disposed between the sidewall of the container and the cover member, wherein the phosphor layer and the cover member are in close contact with each other, a cavity surrounded by the phosphor layer, the cover member, and the sealing material layer is provided over the sidewall of the container, and the cavity is not provided in an optical path of fluorescence emitted from the phosphor layer or mixed light of the fluorescence and the excitation light.

2. The wavelength conversion member according to claim 1, wherein the phosphor layer comprises:

a first layer containing a resin and a phosphor; and a second layer disposed on the first layer and containing a resin, and wherein the second layer is in close contact with the cover member.

3. The wavelength conversion member according to claim 2, wherein an absolute value of a difference in refractive index between the first layer and the second layer is 0.1 or less.

4. The wavelength conversion member according to claim 2, wherein the second layer is free of a phosphor.

5. The wavelength conversion member according to claim 2, wherein the second layer further contains a phosphor.

6. The wavelength conversion member according to claim 5, wherein the first layer and the second layer are made of the same material.

7. A method for producing the wavelength conversion member according to claim 1, the method comprising the steps of:

filling the container with a first curable resin and a phosphor and curing the first curable resin to form a first layer having a recess in a top surface thereof;

filling the recess in the first layer with a second curable resin to be a second layer;

disposing the cover member in close contact with the second curable resin;

curing the second curable resin to form the second layer; and irradiating a sealing material put on a top of the sidewall of the container with laser to soften the sealing material, thus bonding the sidewall of the container and the cover member together.

8. A light-emitting device comprising:

a light source that emits excitation light; and the wavelength conversion member according to claim 1.

* * * * *